United States Patent
Knappe et al.

(10) Patent No.: US 12,019,127 B2
(45) Date of Patent: Jun. 25, 2024

(54) HIGH-RESOLUTION MAGNETOGRAPHIC CAMERA BASED ON OPTICALLY-PUMPED MAGNETOMETER

(71) Applicants: Yoshio Okada, Brookline, MA (US); The Regents of the University of Colorado, a body corporate, Denver, CO (US)

(72) Inventors: Svenja Knappe, Boulder, CO (US); Yoshio Okada, Brookline, MA (US); Sean Krzyzewski, Boulder, CO (US)

(73) Assignees: The Regents of the University of Colorado, body corporate, Denver, CO (US); Moment Technologies, LLC, Brookline, ME (US)

( * ) Notice: Subject to any disclaimer, the term of this patent is extended or adjusted under 35 U.S.C. 154(b) by 271 days.

(21) Appl. No.: 17/296,179

(22) PCT Filed: Nov. 21, 2019

(86) PCT No.: PCT/US2019/062615
§ 371 (c)(1),
(2) Date: May 21, 2021

(87) PCT Pub. No.: WO2020/106957
PCT Pub. Date: May 28, 2020

(65) Prior Publication Data
US 2022/0011386 A1 Jan. 13, 2022

Related U.S. Application Data

(60) Provisional application No. 62/770,591, filed on Nov. 21, 2018.

(51) Int. Cl.
*G01R 33/26* (2006.01)
*G01R 33/24* (2006.01)

(52) U.S. Cl.
CPC ........... *G01R 33/26* (2013.01); *G01R 33/246* (2013.01)

(58) Field of Classification Search
None
See application file for complete search history.

(56) References Cited

U.S. PATENT DOCUMENTS

| 2011/0031969 A1 | 2/2011 | Kitching et al. |
| 2014/0354275 A1 | 12/2014 | Sheng et al. |
| 2016/0116553 A1 | 4/2016 | Kim et al. |

(Continued)

OTHER PUBLICATIONS

International Application No. PCT/US2019/062615, International Search Report & Written Opinion, 10 pages, dated Feb. 7, 2020.

*Primary Examiner* — Jay Patidar (57) ABSTRACT

A magnetographic camera may be based on an optically pumped magnetometer (OPM). The magnetographic camera may measure a spatial distribution of magnetic field produced by a sample that may be stationary in time or may dynamically vary with time. The magnetographic camera may include a magnetic field detector housing containing a vapor cell. The magnetographic camera may include a laser light source to illuminate the vapor cell causing a magnetic field image of a sample to be generated. The magnetographic camera may include an optical detector to encode and store the magnetic field image of the sample that is spatially encoded as a distribution of light.

19 Claims, 10 Drawing Sheets

(56) References Cited

U.S. PATENT DOCUMENTS

2016/0223627 A1\* 8/2016 Shah ................... G01R 33/26
2017/0160352 A1   6/2017 Kornack et al.
2018/0238974 A1   8/2018 Shah et al.
2018/0313908 A1  11/2018 Knappe et al.
2019/0334536 A1\* 10/2019 Chindo ................. G04F 5/145

\* cited by examiner

HIGH-RESOLUTION MAGNETOGRAPHIC CAMERA BASED ON OPTICALLY-PUMPED MAGNETOMETER

CROSS-REFERENCE TO RELATED APPLICATIONS

This application is a national stage of International Application No. PCT/US2019/062615 filed Nov. 21, 2019, which claims priority to U.S. Provisional Application Ser. No. 62/770,591 filed Nov. 21, 2018, each of which is incorporated herein by reference in its entirety for all purposes.

FEDERALLY SPONSORED RESEARCH

This invention was made with government support under grant number NS108898 awarded by the National Institutes of Health. The government has certain rights in the invention.

TECHNICAL FIELD

Various embodiments of the present technology relate generally to the field of imaging the spatial distribution of magnetic field of biologic and non-biologic materials that may change over time and more particularly to the apparatus and methods for making such a static or dynamic spatial imaging of magnetic field distributions.

BACKGROUND

A magnetographic camera is an apparatus that can produce spatial images of the magnetic field produced by a sample, very much analogous to a photographic camera. A photographic camera provides multipixel spatial images of photic distribution with the modern cameras providing more than 1 Megapixels of spatial resolution. A photographic camera can take pictures of objects with a frame rate per second (fps) of 1-10 fps or higher. Magnetographic cameras may provide multipixel images of a stationary, non-time varying spatial distribution of magnetic field or dynamically time-varying magnetic fields images at frame rates greater than 1000 fps.

A magnetographic camera is a general-purpose apparatus potentially useful in many areas of applications in both biological and physical sciences, medicine, and industry. Potential applications of this type of camera includes detection of cancer cells in human breast, prostate, ovaries, or skin cancer, imaging activity of neurons and other cell types (such as glial cells) in the brain in vitro or in vivo, characterization of magnetization of minerals for understanding the life of planets such as the Earth or the Moon (planetary geology and astronomy), and inspection of impurities and breaks or cracks in electrical circuits or metallic shields used in jet planes or inspecting the integrity of structures (non-destructive evaluation NDE of materials).

SUMMARY

Various embodiments of the present technology relate generally to the field of imaging the spatial distribution of magnetic field of biologic and non-biologic materials that may change over time and more particularly to the apparatus and methods for making such a static or dynamic spatial image of magnetic field distributions. Some embodiments provide for apparatus and methods for a novel magnetographic camera which enables a unique ability to determine the spatial distribution of magnetic field in a biological or non-biological sample with high spatial and temporal resolutions and high sensitivity. The use of these embodiments will greatly expand the applications of optically-pumped magnetometer OPM-based cameras in medicine, science, and industry.

Some embodiments provide for a magnetographic camera with a thin OPM cell having a uniform light distribution. The thin OPM cell with a highly collimated light source infers the smallest useable pixel size for high spatial distribution. The uniform light distribution increases the uniformity of the magnetic field image, making the calibration easier for magnetic field imaging. The thin cell is encased in a vacuum package that allows to bring it very close to a sample of interest. This allows various embodiments of the present technology to create images with high signal-to-noise ratios.

Some embodiments include a reflective coating on the cell surface. This coating increases the signal level by a factor of two. Various embodiments provide an apparatus and method which enables the detected distribution of magnetic field to be transmitted as a spatial distribution of collimated light to an optical detector such as a CMOS or a CCD device for the purpose of digitizing the magnetic field distribution and storing the images.

A magnetic shield encased within the camera housing can be used in some embodiments for reducing the magnetic field present in the environment to enable the detection of the magnetic field produced by the sample of interest. Some embodiments of the magnetic field noise cancellation will enable the camera to be used in any ordinary room such as a patient room in a clinic or a magnetically unshielded laboratory for the purpose of taking magnetographic pictures of samples.

Figure 1:
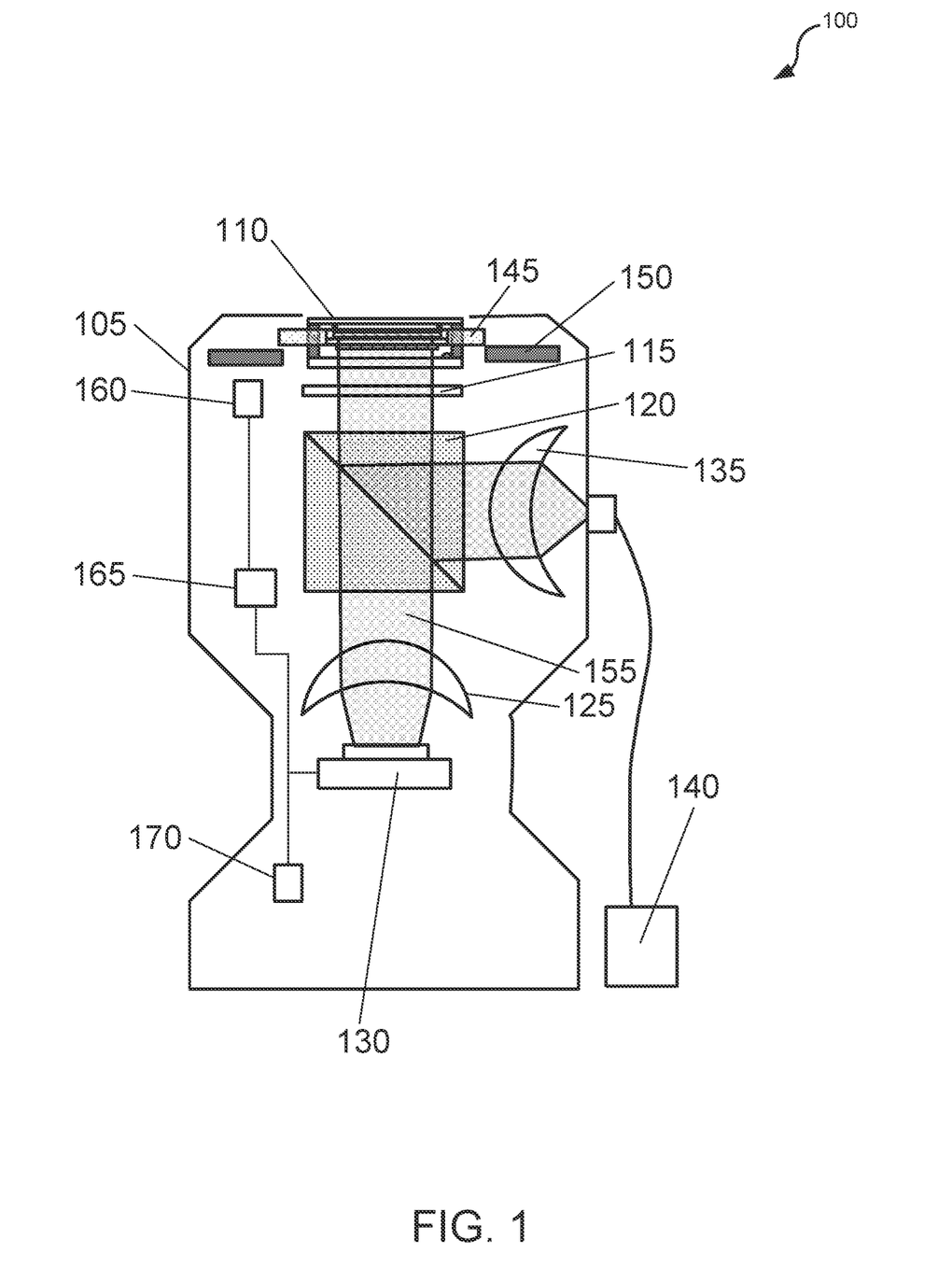
FIG. 1 is a schematic of an example of an assembly of a magnetographic camera that may be used in some embodiments of the present technology.

In one embodiment, a magnetographic camera may be based on an OPM. The magnetographic camera may measure a spatial distribution of magnetic field produced by a sample that may be stationary in time or may dynamically vary with time. The magnetographic camera may include a magnetic field detector housing containing a vapor cell. The magnetographic camera may include a laser light source to illuminate the vapor cell causing a magnetic field image of a sample to be generated. The magnetographic camera may include an optical detector to encode and store the magnetic field image of the sample that is spatially encoded as a distribution of light. In an example, the magnetographic camera may also include a magnetic field cancellation system in which magnetic field interference from an environmental magnetic field is reduced to a level below a magnetic field from samples of interest. The magnetic field cancellation system may include three sets of magnetic field noise cancellation coils. A first set of coils may produce a magnetic field perpendicular to a surface of the optical detector, a second set of coils may produce a magnetic field horizontal along one axis, and a third set of coils may produce a horizontal magnetic field along a direction orthogonal to the second set of coils. The magnetographic camera may further include a magnetic field reference detector (e.g., labeled 160 as shown in FIG. 1) to measure the magnetic field in an environment. In another example, the optical detector may include one or more reference areas for measuring a magnetic field in each pixel. The one or more reference areas may include one or more pixels located at a corner of a surface of the optical detector. In yet another example, the sample may be a biologic sample or a non-biologic sample. In still another example, the magnetic field detector may include an evacuated box made at least partially of an optically transparent material allowing light from the laser light source to pass through. The optically transparent material may include glass. The magnetic field detector may also include a vapor cell filled with a spin-polarizable atomic species. The magnetic field detector may further include thermal standoffs to thermally insulate the box from the vapor cell. The magnetic field detector may include a light source with a heater to heat the vapor cell to a desired temperature. The desired temperature to heat the vapor cell may be above 120° C. The spin-polarizable atomic species may include alkali atoms. The vapor cell may have a thickness of between 10 μm and 1,000 μm to increase spatial resolution of magnetic field detection to a pixel size as small as 35 μm×35 μm and to increase temporal resolution to more than 1,000 frames per second (fps). The magnetic field detector further comprises a molecular sieve to improve a vacuum. The vacuum space is 1-500 μm to allow a strength of magnetic field from the sample to be increased. The magnetographic camera may also include a controller (e.g., controller 165 as shown in FIG. 1) that provides an electric current proportional to a magnetic variation sensed by the magnetic field reference detector to the three sets of magnetic field noise cancellation coils thereby reducing the environmental magnetic field sensed by the OPM.

Embodiments of the present invention also include computer-readable storage media containing sets of instructions to cause one or more processors to perform the methods, variations of the methods, and other operations described herein.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology relate generally to the field of imaging the spatial distribution of magnetic field of biologic and non-biologic materials that may change over time and more particularly to the apparatus and methods for making such a static or dynamic spatial imaging of magnetic field distributions. More specifically, some embodiments relate to a magnetographic camera based on a device called optically-pumped magnetometer (OPM). An OPM is sometimes also called atomic magnetometer (AM) or optically-pumped atomic magnetometer (OPAM).

An OPM is a device that measures the magnetic field produced by a sample next to the OPM using a vapor cell filled with a spin-polarized gaseous atomic species (e.g., rubidium (Rb)). The magnetic field that penetrates through the OPM cell alters spin-polarization and with it, the transmission (or polarization) of laser light through the cell. Thus, the strength of the magnetic field can be measured by the amount of attenuation of the light through the cell or by the dichroism generated in the cell, which can change the polarization of the light.

Various embodiments of the camera described in this application use a unique set of principles of operation based on the OPM. The magnetic field detector of the OPM is a vapor cell, which according to various embodiments, can be a rectangular box with a cavity inside to contain one species of atom (e.g., rubidium (Rb)). Some embodiments of the OPM use a single laser beam to spin-polarize one species of atoms inside the cavity, and also to monitor the magnetic field. The OPM can operate in the spin-exchange suppressed mode and by monitoring the transmission of the single laser beam. The cell can be suspended in a vacuum enclosure also made from silicon and glass to create a thermal shield of minimal thickness. The vapor cell can be heated (e.g., to 150° C.) in order to operate the OPM with high sensitivity. This vacuum structure used in various embodiments enables the outer casing of the OPM to operate at room temperature. The light from the collimated laser can be passed through the cell and reflected back. The reflected laser beam can then be detected with a multi-channel detector array.

Various embodiments of the magnetographic camera based on the principle of operation described above can provide several novel features. These features include, but are not limited to, the following: (1) high level of sensitivity (400 fT/√Hz for a pixel size of 50 μm×50 μm and 50 fT/√Hz for a pixel size of 1000 μm×1000 μm), 10-100 times better than existing OPM-based cameras, (2) high spatial resolution with a pixel size as small as 35 µm×35 µm, which is at least 10× better than other OPM-based cameras, (3) very fast frame rate of up to 5000 fps, which is 10-100× better than most of the OPMs, (4) short measurement distance between the magnetic field detector (OPM cell) and a sample of 10-500 µm which increases the strength of the magnetic field from a given sample and thus increases signal-to-noise ratio and consequently the sensitivity of the camera. These unique features open novel areas of application of our camera as mentioned above in medicine, science and industry, making various embodiments of this invention useful to the society.

In addition to these novel features of the magnetic field detection component of the camera, the apparatus in various embodiments has another unique feature that distinguishes itself from other magnetographic cameras. Some embodiments of the apparatus contain a device within the camera for removing interference from the magnetic field in the room or other environments where the camera will be used. This noise cancellation coil system can be encased within the housing of the camera.

The noise cancellation system used in various embodiments can reduce two types of magnetic field interference. The first type is the DC magnetic field of the Earth. This field strength in any ordinary room is approximately 50 µT. This DC field should typically be reduced to a value of less than 50 nT for our OPM to operate at its highest sensitivity. According to some embodiments of the noise cancellation scheme, the required field attenuation can be achieved by using multiple sets of coils (e.g., three sets of coils) all in planes parallel to each other in order to allow free access for the sample as described in detail below: (1) a single circular coil surrounding the vapor cell in the plane parallel to the sample surface of the camera produces a magnetic field parallel to the laser beam to reduce the longitudinal component of the field perpendicular to the detector surface, (2) a set of coils on either side of the cell along one axis (say x axis) producing a field in the x axis and (3) a set of coils on either side of the cell along the orthogonal axis (say y axis) producing a field in the y axis.

Each set of coils can produce a magnetic field to attenuate all three components of the environmental field. The field in two directions, say x and z, are modulated with a field at the same frequency, but out of phase with each other. The field in the y direction can be modulated at a different frequency. Other combinations could also be chosen. The signal from a first reference pixel can be demodulated with a digital phase sensitive detector at the two frequencies, referenced to three modulation signals. This yields three outputs that carry the magnetic field information in the directions of the coil sets. Three error signals are generated from the three signals and used to apply DC currents to the coils to compensate the magnetic field at the location of the first reference pixel to zero.

Some embodiments of the noise cancellation system can also reduce the second type of magnetic field interference, that is the field that varies in time. The environmental field fluctuates in time due to changes in the Earth field, due to presence of magnetic field generating objects such as cars and trucks outside or elevators inside. This second type of noise can be attenuated by using a common mode rejection technique in which the magnetic field at one or more corners of the detector (vapor cell) is subtracted from the magnetic field detected in each voxel used for measuring the signal from a sample. Instead of using the voxels in a corner of the vapor cell, a separate vapor cell could be used to increase the gradiometer baseline.

Traditional technologies have used a set of three homogeneous coils to actively zero the field at the location of a vapor cell using the signals measured in the polarization rotation of a linearly polarized probe beam perpendicular to a circularly polarized pump beam. By modulating the coils at different frequencies, the components of the magnetic field could be deduced and used to feed back onto the coils. In contrast, various embodiments of the present technology use a transmission-based single-beam magnetometer, which measures the longitudinal atomic polarization rather than the transverse one.

With the noise and field cancellation system, some embodiments of the camera can be used in any environment without requiring extra magnetic shielding. This system can be used to reduce the environmental magnetic field interference to a level where the interference is small enough to be ignored for performing the magnetic field imaging of samples of interest such as a female breast with possible cancerous tissue. This active noise cancellation system used in one or more embodiments makes the camera very versatile, expanding its areas of application. The camera also does not contain cryogenic liquids and can be mounted in any orientation. In some embodiments, the camera may be a handheld device.

In the following description, for the purposes of explanation, numerous specific details are set forth in order to provide a thorough understanding of embodiments of the present technology. It will be apparent, however, to one skilled in the art that embodiments of the present technology may be practiced without some of these specific details or with variations of the configurations described. For example, instead of one laser beam, two beams could be used. One laser can be used to pump the atoms and one laser to probe them. The two laser beams can either be parallel or have an angle between them.

As another example, instead of using a heat filter to absorb light to heat the vapor cell, the vapor cell could be heated electrically. In some embodiments, the lasers could be included inside the camera housing or outside and the light could be coupled to the camera housing with optical fibers. The reference detector for the gradiometry could be located outside or inside the camera housing. Instead of one reflector on the back side of the vapor cell, some embodiments may be configured so that both sides could have partial reflectors and the light could be transmitted through the cell more than twice. If two lasers are used it could be reflecting only one of the laser frequencies. As another example of a possible variations, instead of operating in the spin-exchange suppressed regime, the OPM could operate at any ambient background field and not use the coils to compensate the field to zero.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

FIG. 1 is a schematic of an example of an assembly of a magnetographic camera that may be used in some embodiments of the present technology. In the embodiments illustrated in FIG. 1, camera assembly 100 can include housing 105, packaged vapor cell 110, quarter-wave plate 115, polarizing beam-splitter 120, lenses 125, optical detector 130, lenses 125 and 135, laser source 140, and coils 145 and 150. In accordance with various embodiments, the entire camera assembly 100 may be a size of an ordinary photographic camera that is light enough to be hand-held so that it can be used with the camera in any orientation. Housing 105 of the camera 100 can house all the components. The packaged vapor cell 110 used in some embodiments of the camera assembly 100 is described in detail in FIG. 2.

A sample can be placed on the detector surface 110. In accordance with various embodiments, the camera detects the magnetic field from a sample placed next to the surface of the detector (a vapor cell). The spatial pattern of magnetic field on the detector surface is transmitted as a spatially-coherent distribution of light to an optical detector at the end of the optical path 155. The spatial distribution of light is encoded and digitally stored just as in an ordinary photographic camera.

If the camera 100 is positioned as shown; then the sample is above the detector 110. The camera can be also positioned upright; in this case the same is below the detector surface. The quarter-wave plate 115 can convert a linearly polarized light into a circularly polarized light for polarizing the atoms in the vapor cell along one direction. The laser source 140 can send laser light to the camera that is collimated by a set of lenses 135. The polarizing beam-splitter 120 splits the collimated laser light from the laser source 140 to send the light to the packaged vapor cell 110.

The reflected light from the packaged vapor cell 110 varies spatially across the vapor cell surface corresponding to the magnetic field produced by a sample at the surface. This spatial variation of light encodes the magnetic field from the sample. The spatially encoded light is imaged onto an optical detector 130 such as a CMOS or a CCD or a photomultiplier detector by a set of lenses 125. The DC component of the magnetic field in the environment can be attenuated by three orthogonal sets of coils (e.g., coil 145 that produces a vertical field and coil 150 that produces a horizontal field along one axis the second coil that produces a horizontal field along the orthogonal horizontal axis is not shown).

Figure 2:
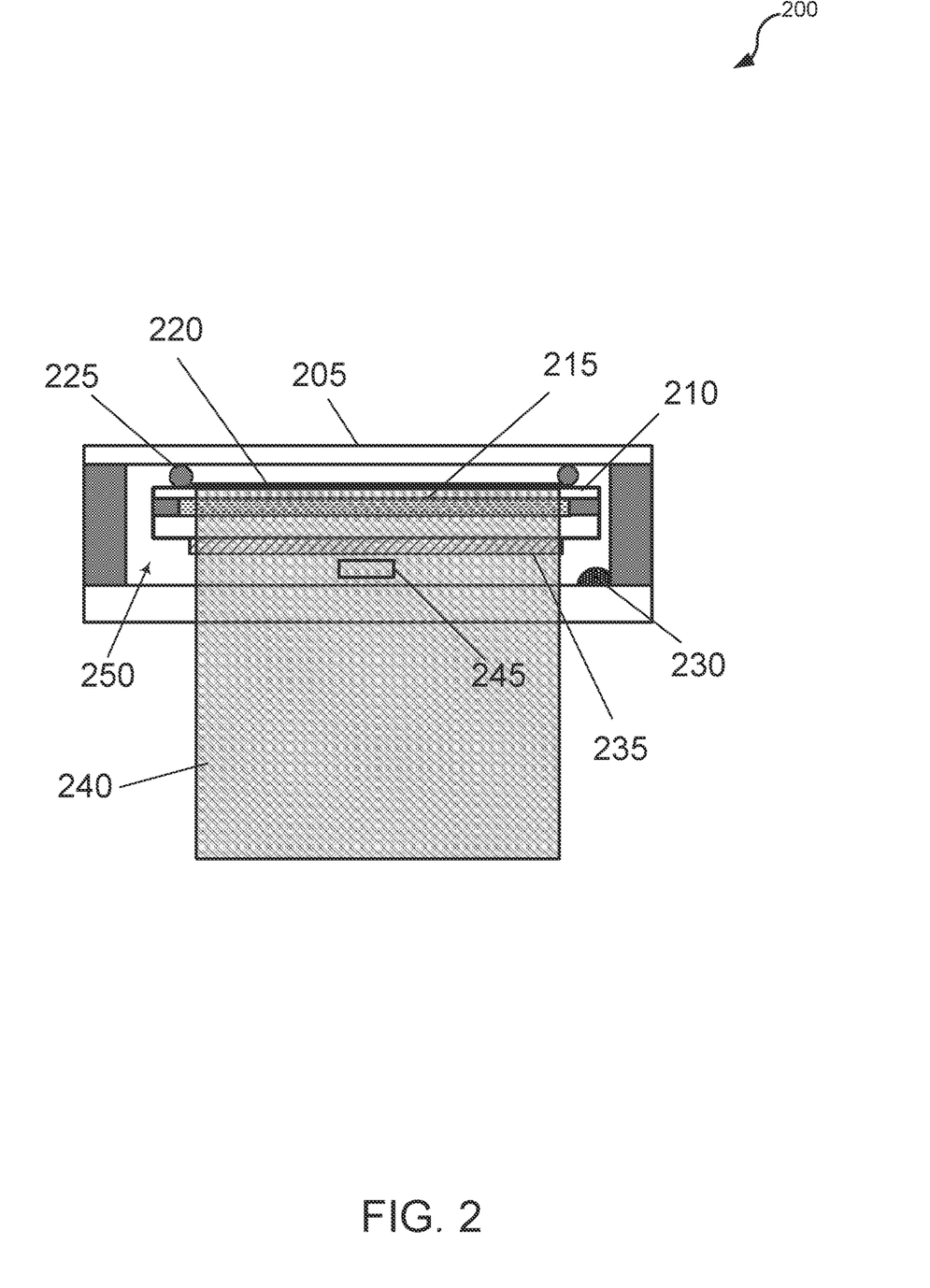
FIG. 2 is a schematic view of an example of a magnetic field detector component of the camera having a vapor cell filled with one species of atom (e.g., rubidium) that is suspended in a vacuum compartment.

FIG. 2 shows the detail of a detector of the OPM that can be used in some embodiments. As illustrated in FIG. 2, some embodiment of the packaged vapor cell 200 can include a detector surface 205, vapor cell housing 210, atomic vapor 215, reflector 220, thermal standoffs 225, molecular sieve 230, heat filter 235, and laser light beam 240. A sample can be placed on the detector surface 205. The magnetic field from the sample penetrates through the vapor cell housing 210, which contains an atomic vapor of spin-polarizable atoms (e.g., rubidium or Rb) 215. The reflector 220 can reflect the laser light so that the magnetic field attenuates the transmitted through the vapor cell twice once toward the reflector 210 and once on the way back from the reflector. Thermal standoffs 225 (e.g., made of beads from a suitable material with low thermal conductivity) can thermally isolate the outer casing of the detector since the vapor cell operates at approximately 150° C. A heater 245 can be used to maintain the detector at a given operating temperature (e.g., 150° C. or 120° C.). This allows the detector to operate in the regime where spin-exchange decoherence is suppressed. A molecular sieve 230, called getter, increases the vacuum condition in the compartment. Heat filter 235 can absorb a second color of laser light to heat the vapor cell.

Some embodiments of the magnetographic camera can use a thin OPM vapor cell and a thin gap between one surface of the cell facing the sample and the sample itself. Since the magnetic fields from the samples fall off fast, bringing the cell closer to the sample results in larger signal amplitudes. The vapor cell housing 210 can be made by etching or drilling holes into a silicon wafer and anodically-bonding glass to both sides. In order to thermally isolate the cell from the sample, the cell can be placed into a nonmagnetic vacuum package. As illustrated in FIG. 2, the cell can be mounted onto standoffs 225 made from small glass beads, which are attached to the "window" that of the vacuum package that is in contact with the sample. The window can be coated with a reflective material, so the window acts as a mirror for the light transmitted through the cell and retro-reflects it back through the sample.

Figure 3A:
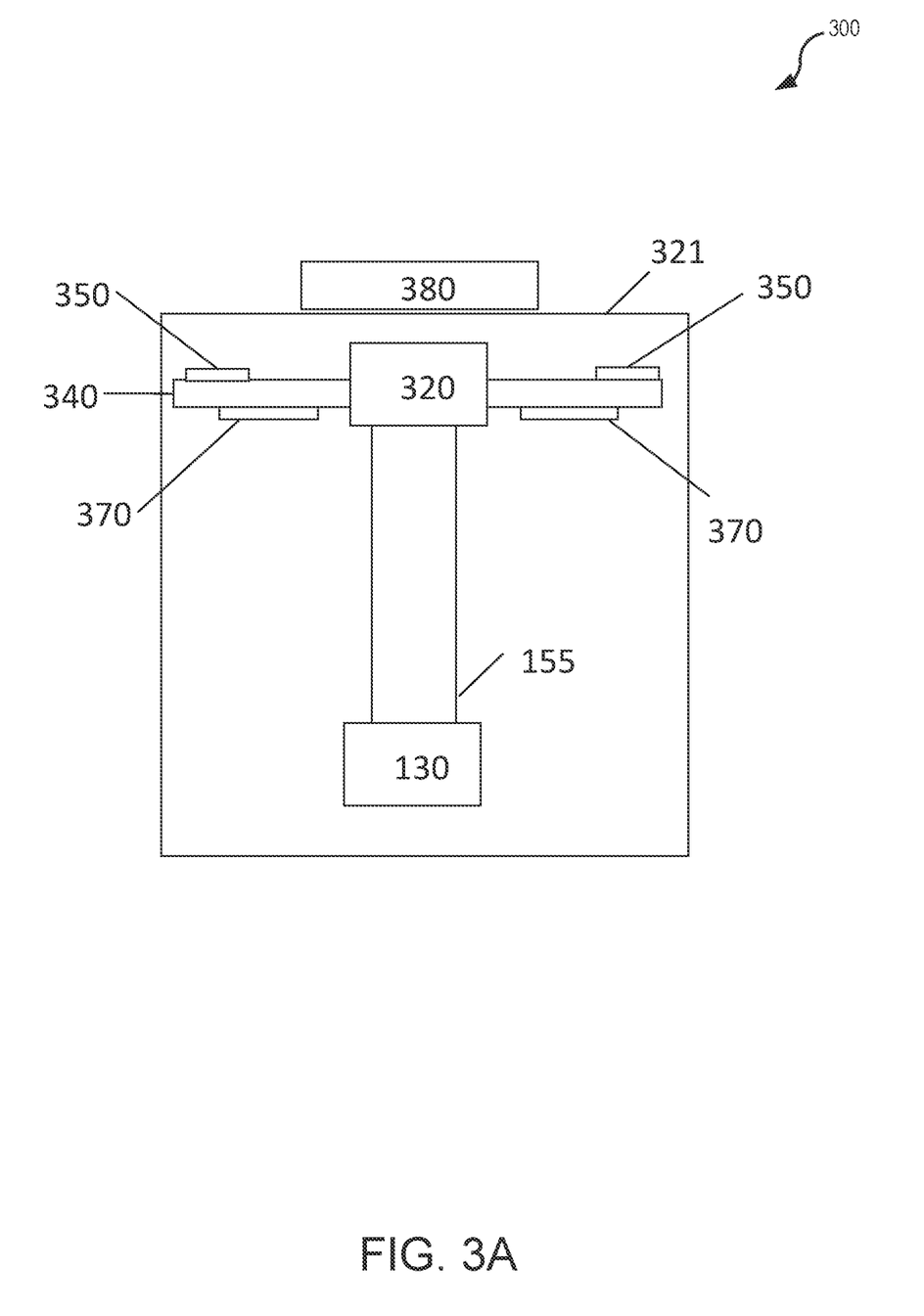
FIGS. 3A-3B illustrate an example of a magnetic noise cancellation system encased within the camera body to reduce the DC field of the environment to a level that is sufficiently low (<10 nT) for the OPM to operate in any magnetically unshielded environment.
Figure 3B:
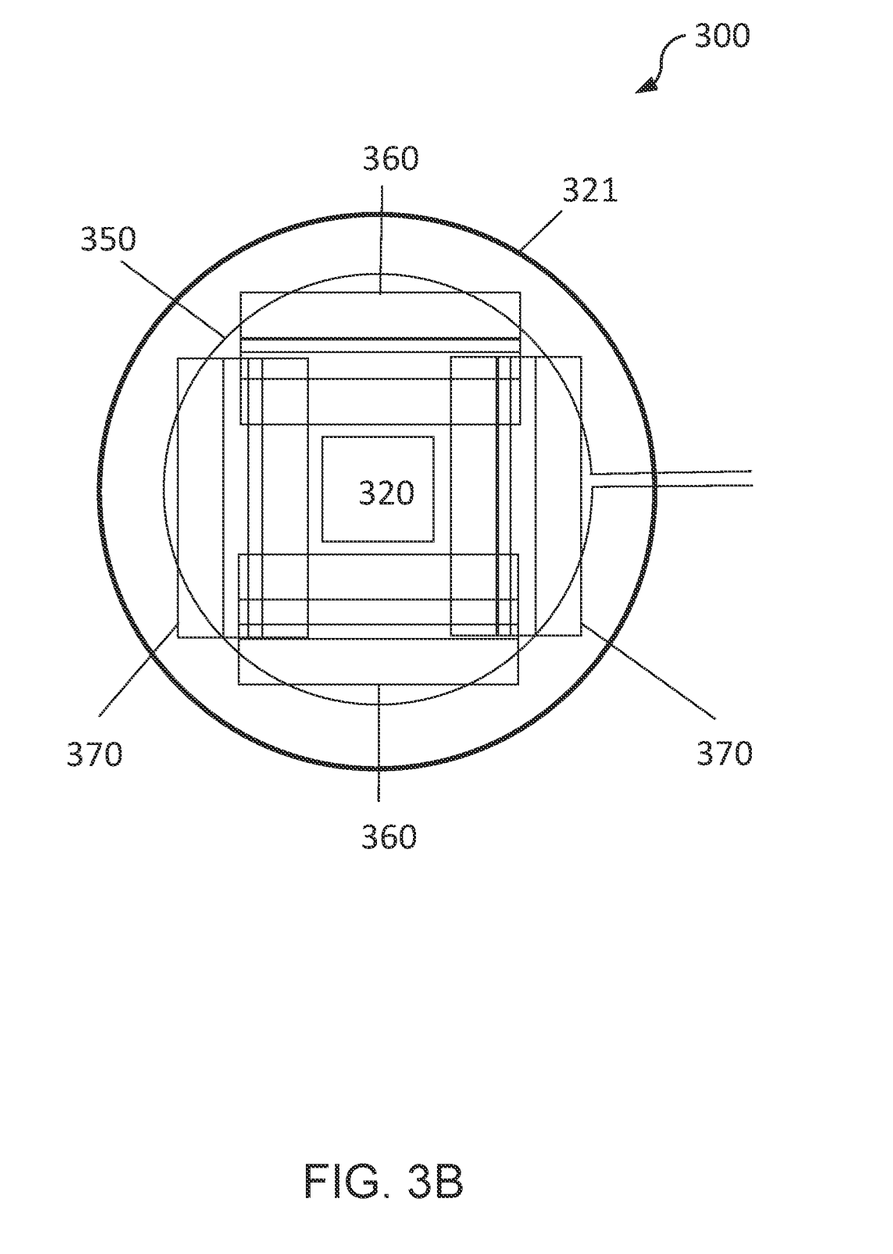

FIGS. 3A-3B show schematics of the coil system 300 situated inside of housing 321 for DC noise cancellation. FIG. 3A shows a side view of the coil system 300, while FIG. 3B shows a top view from the direction of the sample 380. The magnetic field inside the vapor cell 320 can be reduced by using three sets of orthogonally oriented coils 350, 360, and 370 patterned onto a common substrate 340. Coil 350 can produce a magnetic field along the axis perpendicular to the detector surface of the cell, called the z axis. Coil set 360 can produce field connecting with a strong a horizontal component along one axis, say x axis, in the plane of the vapor cell 320. Coil set 370 can produce a similar magnetic field pattern along the orthogonal axis, the y axis in the plane of the vapor cell 320.

Small alternating fields around 1-2 kHz can be applied perpendicular to the laser beam with coil sets 360 and 370, at two different frequencies. The signal of each pixel of the optical detector is passed through a digital lock-in amplifier referenced to the signal driving the field. The output signal of the lock-in amplifier can exhibit a dispersive lineshape with a steep zero-crossing at zero B field as the DC field is scanned. This allows detection at a higher frequency of a few kilohertz instead of DC, which gives a favorable noise performance. It also makes the camera sensitive to the magnetic field components in the direction of modulation. The angles between the coils and the laser beam can be chosen in other directions as the ones described in this embodiment.

In addition, coil 350 can be used to apply a modulated field in the z direction at the same frequency as 360, but 90 degrees out of phase. For one pixel (or a collection of pixels) the lock-in amplifier signal can be calculated with reference to the current applied to coil 350. For this pixel, three lock-in signals can be calculated in all: one for coil set 370 at a first modulation frequency, giving and output signal proportional to the DC magnetic field component along the y direction; and two at the second modulation frequency, 90 degrees out of phase, giving output signals proportional to the DC magnetic field components along the x and z directions.

These three output signals can be fed back to the modulation coils 350, 360, and 370, such that the output signal always remains zero. When this is done in all three dimensions, it ensures that all voxels of the camera are operating in the high-sensitivity regime. In order to suppress ambient noise, the output of all pixels can be subtracted from the output of a reference location. This reference can be a voxel either within the vapor cell 320 (e.g., one of the voxels or an average of several voxels) or in a separate vapor cell located in or outside the camera.

Figure 4:
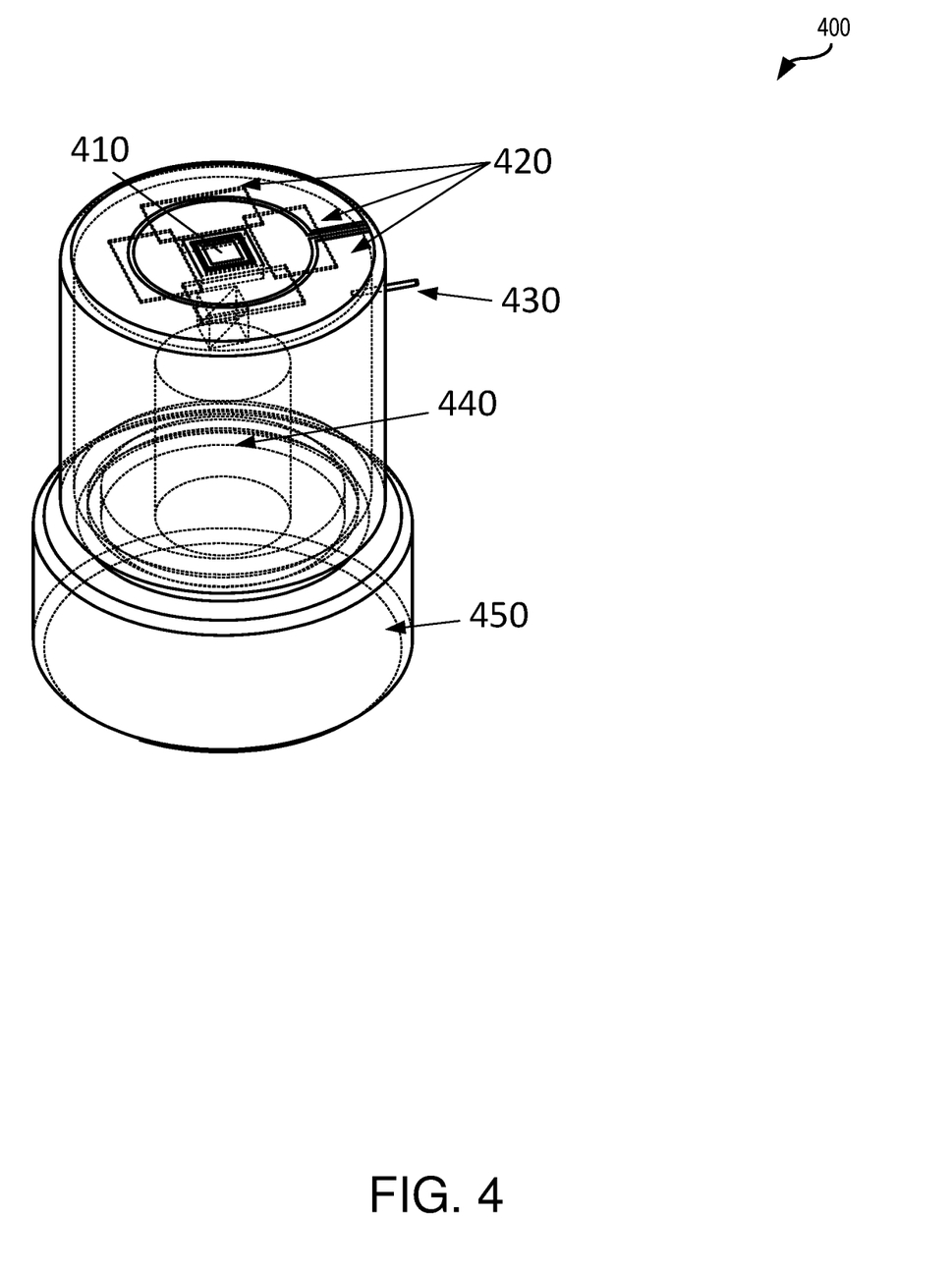
FIG. 4 is a drawing of the magnetic camera that may be used in various embodiments of the present technology.

FIG. 4 is a drawing of the magnetic camera 400 that may be used in various embodiments of the present technology. As illustrated in the embodiments shown in FIG. 4, camera 400 can include MEMS cell and package 410, active compensation coils 420, optical fiber 430, optics 440, and CMOS camera 450. In some embodiments MEMS cell and package 410 may include a reflective coating on the cell surface. This coating can increase the signal level by a factor of two or more. A sample can be placed on the top, above the MEMS cell 410. The light can be coupled through an optical fiber 430. In the embodiments illustrated in FIG. 4, the CMOS camera 450 located below the optics 440. In accordance with various embodiments, magnetic camera 400 may be small (e.g., with a from 2-8 cm).

Magnetic camera 400 may also include multiple sets (e.g., three sets) of active compensation coils 420. A magnetic shield encased within the camera housing can be used in some embodiments for reducing the magnetic field present in the environment to enable the detection of the magnetic field produced by the sample of interest. Some embodiments of the magnetic field noise cancellation will enable the camera 400 to be used in any ordinary room such as a patient room in a clinic or a magnetically unshielded laboratory for the purpose of taking magnetographic pictures of samples.

The noise cancellation system used in various embodiments can reduce two types of magnetic field interference. The first type is the DC magnetic field of the Earth. This field strength in any ordinary room is approximately 50 µT. This DC field should typically be reduced to a value of less than 50 nT for our OPM to operate at its highest sensitivity. According to some embodiments of the noise cancellation scheme, the required field attenuation can be achieved by using multiple sets of coils 420 (e.g., three sets of coils) all in planes parallel to each other. Each set of coils can produce a magnetic field to attenuate all three components of the environmental field. The field in two directions, say x and z, are modulated with a field at the same frequency, but out of phase with each other. The field in the y direction can be modulated at a different frequency. Other combinations could also be chosen. The signal from a first reference pixel can be demodulated with a digital phase sensitive detector at the two frequencies, referenced to three modulation signals. This yields three outputs that carry the magnetic field information in the directions of the coil sets. Three error signals are generated from the three signals and used to apply DC currents to the coils to compensate the magnetic field at the location of the first reference pixel to zero.

Some embodiments of the noise cancellation system can also reduce the second type of magnetic field interference, that is the field that varies in time. The environmental field fluctuates in time due to changes in the Earth field, due to presence of magnetic field generating objects such as cars and trucks outside or elevators inside. This second type of noise can be attenuated by using a common mode rejection technique in which the magnetic field at one or more corners (e.g., corner(s) 250 as shown in FIG. 2) of the detector (vapor cell) is subtracted from the magnetic field detected in each voxel used for measuring the signal from a sample. Instead of using the voxels in a corner of the vapor cell, a separate vapor cell (e.g., 170, as shown in FIG. 1) could be used to increase the gradiometer baseline.

Figure 5:
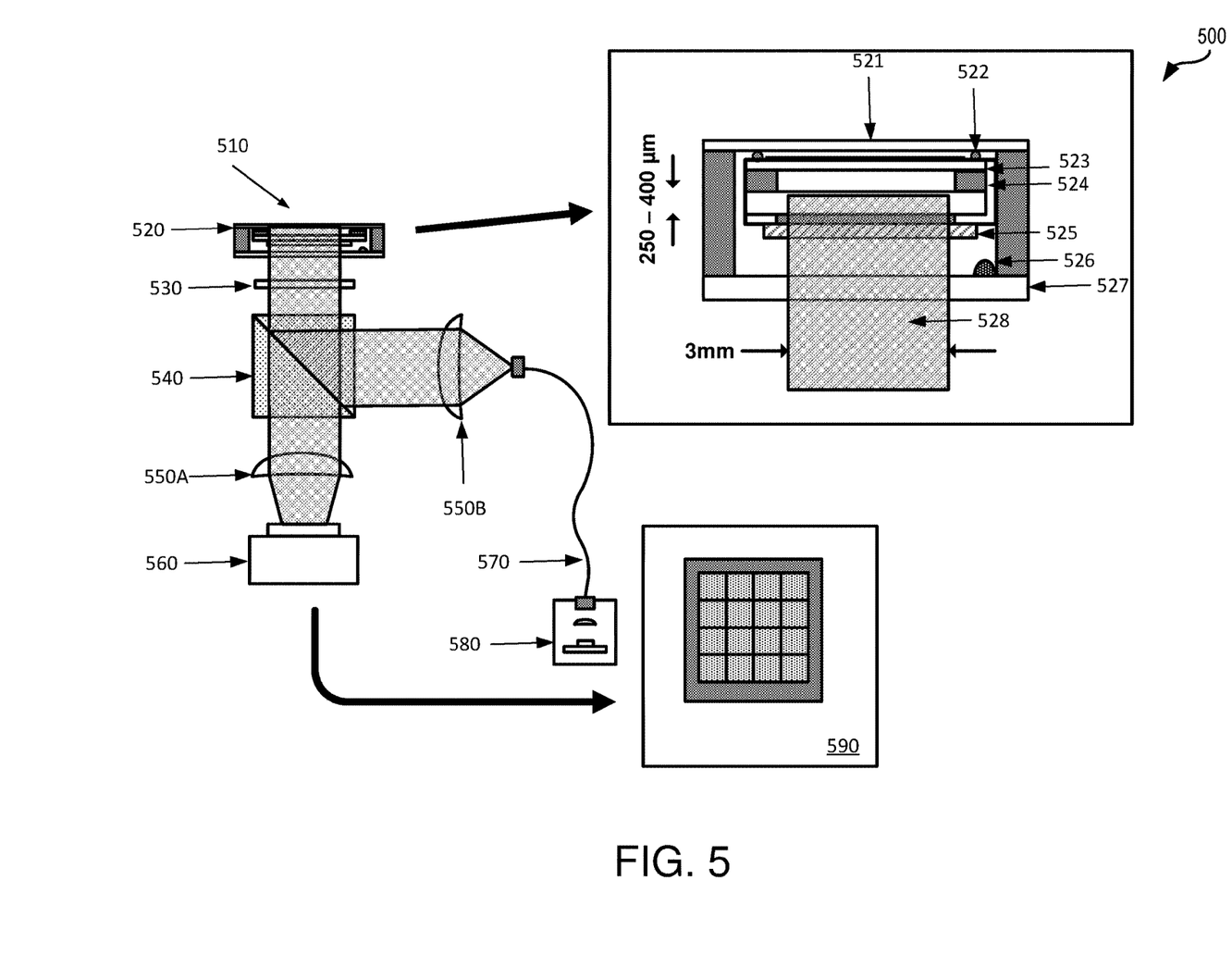
FIG. 5 illustrates a set of components that may be used in some embodiments of the present technology.

FIG. 5 illustrates a set of components for a camera 500 that may be used in some embodiments of the present technology. As illustrated in the embodiments shown in FIG. 5, camera 500 can include a sample surface (e.g., at room temperature) 510, a vapor cell package 520, a quarter-wave plate 530, a polarizing beam splitter 540, a lenses 550A-550B, an optical camera 560, an optical fiber 570, and a DFB laser 580. A sample can be placed on the sample surface 510 and light can be transmitted from laser 580 through an optical fiber 570. Lens 550B can collimate the laser light before a polarizing beam splitter 540 allowing for imaging of the sample using optical camera 560.

While only a single laser beam is illustrated in FIG. 5, some embodiments may use multiple laser beams. The single laser beam configuration can spin-polarize one species of atoms inside the vapor cell package 520, and also to monitor the magnetic field. The camera 500 can operate in the spin-exchange suppressed mode and by monitoring the transmission of the single laser beam. The light from the collimated laser can be passed through the vapor cell package 520 and reflected back where it can be detected with a multi-channel detector array 590.

As illustrated in FIG. 5, some embodiment of the packaged vapor cell 520 can include a sample surface 521, thermal standoffs 522, reflector 523, vapor cell 524, heat filter 525, getter 526, vacuum enclosure 527, and light path 528. A sample can be placed on the sample surface 521. The magnetic field from the sample penetrates through the vapor cell 524. In some embodiments, the vapor cell 524 can contain an atomic vapor of spin-polarizable atoms (e.g., rubidium or Rb) 215. The laser light can be reflected by reflector 523 so that the magnetic field attenuates the transmitted through the vapor cell 524 twice—once toward the reflector 523 and once on the way back from the reflector 523.

As illustrated in FIG. 5, the thermal standoffs 522 (e.g., made of beads from a suitable material with low thermal conductivity) can thermally isolate the outer casing of the detector since the vapor cell 524 operates, e.g., using heater 245 as shown and described above with reference to FIG. 2, at approximately 150° C. This allows the detector to operate in the regime where spin-exchange decoherence is suppressed. A molecular sieve, called a getter 526, can be used to increase the vacuum condition in the compartment. Heat filter 525 can be used in some embodiments to absorb a second color of laser light to heat the vapor cell 524.

Figure 6:
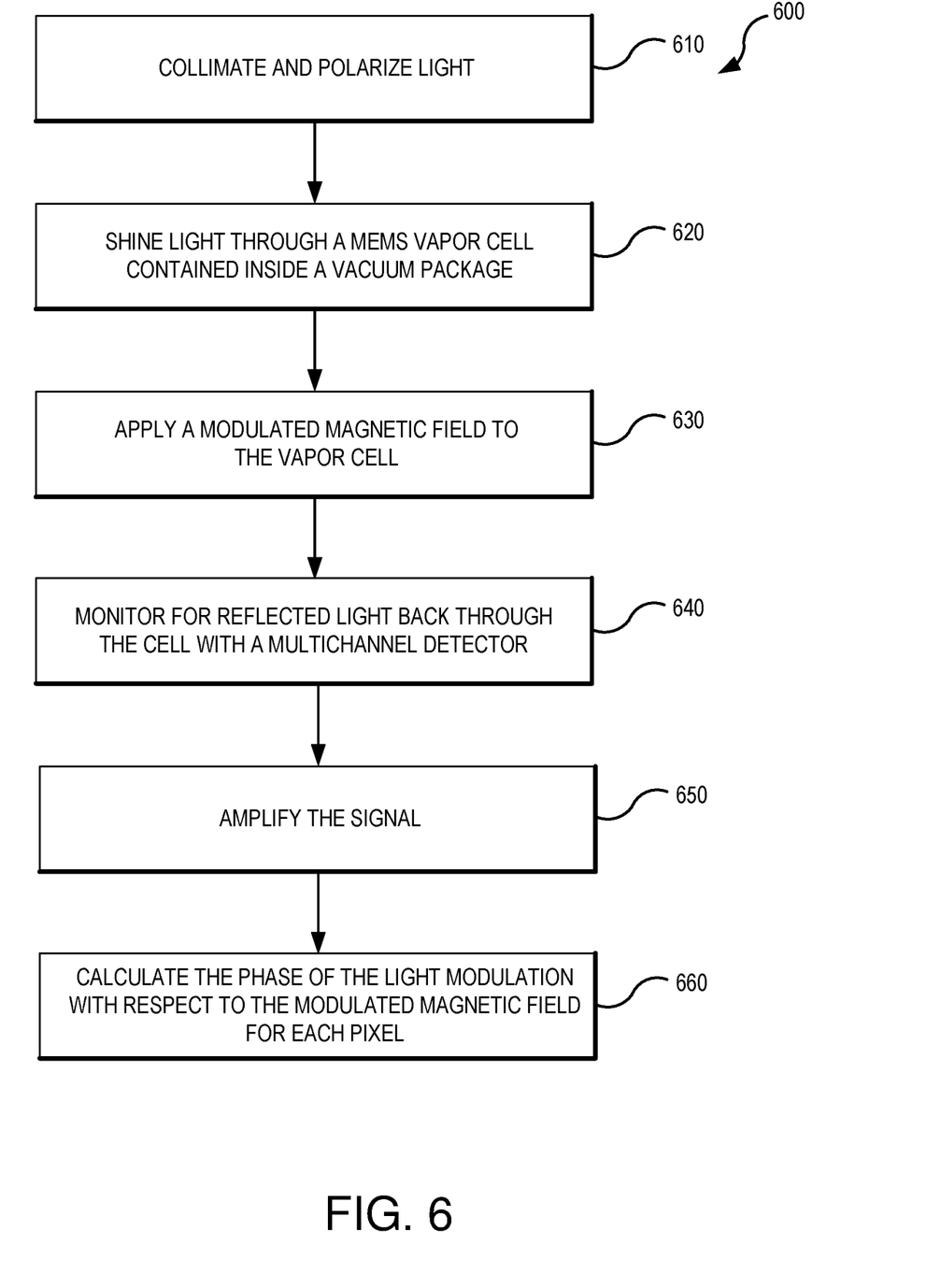
FIG. 6 is a flowchart illustrating a set of operations for operating a magnetic camera in accordance with some embodiments of the present technology.

FIG. 6 is a flowchart illustrating a set of operations 600 for operating a magnetic camera in in accordance with some embodiments of the present technology. In the embodiments illustrated in FIG. 6, generation operation 610 generates a collimated and polarized light. Illumination operation 620 shines the light through the MEMS vapor cell contained inside the vacuum package. Application operation 630 applies a modulated magnetic field to the vapor cell. Monitoring operation 640 monitors for reflected light back through the cell (e.g., that is detected at with a multichannel detector). Amplification operation 650 amplifies the signal. Calculation operation 660 calculates the phase of the light modulation with respect to the modulated magnetic field for every pixel by multiplying the signal from the detected light with the reference signal and low-pass filtering it, e.g., lock-in amplifier.

Figure 7:
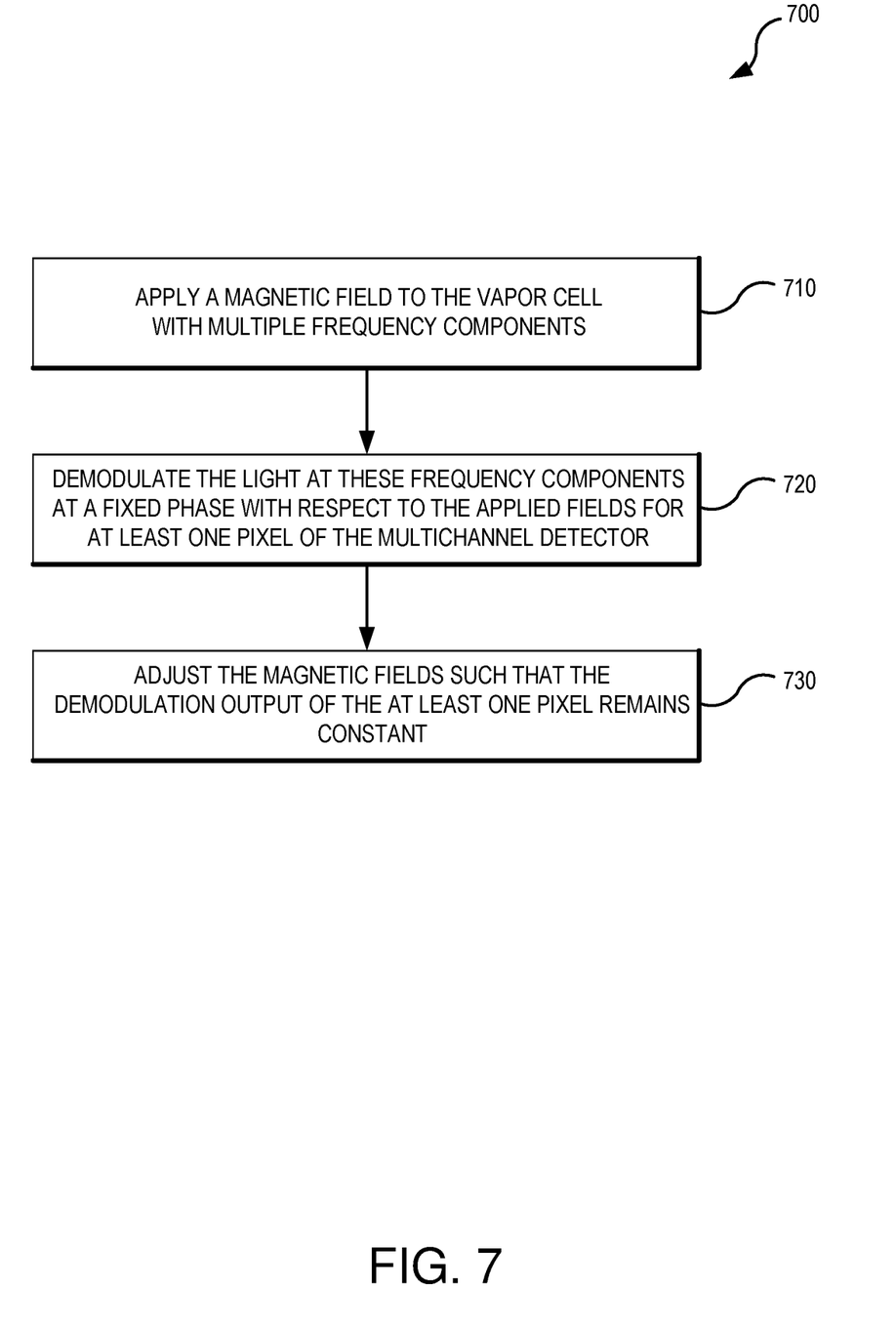
FIG. 7 is a flowchart illustrating a set of operations for field cancellation that may be used in accordance with one or more embodiments of the present technology.

FIG. 7 is a flowchart illustrating a set of operations 700 for field cancellation that may be used in accordance with one or more embodiments of the present technology. As illustrated in FIG. 7, application operation 710 applies a magnetic field to the vapor cell with one or multiple frequency components corresponding to the measurements in different spatial directions of the magnetic field. Demodulation operation 720 demodulates the light at these frequency components at a fixed phase with respect to the applied fields for at least one pixel of the multichannel detector with a lock-in amplifier. Adjustment operation 730 adjusts the magnetic fields such that the demodulated output of the at least one pixel remains constant.

Figure 8:
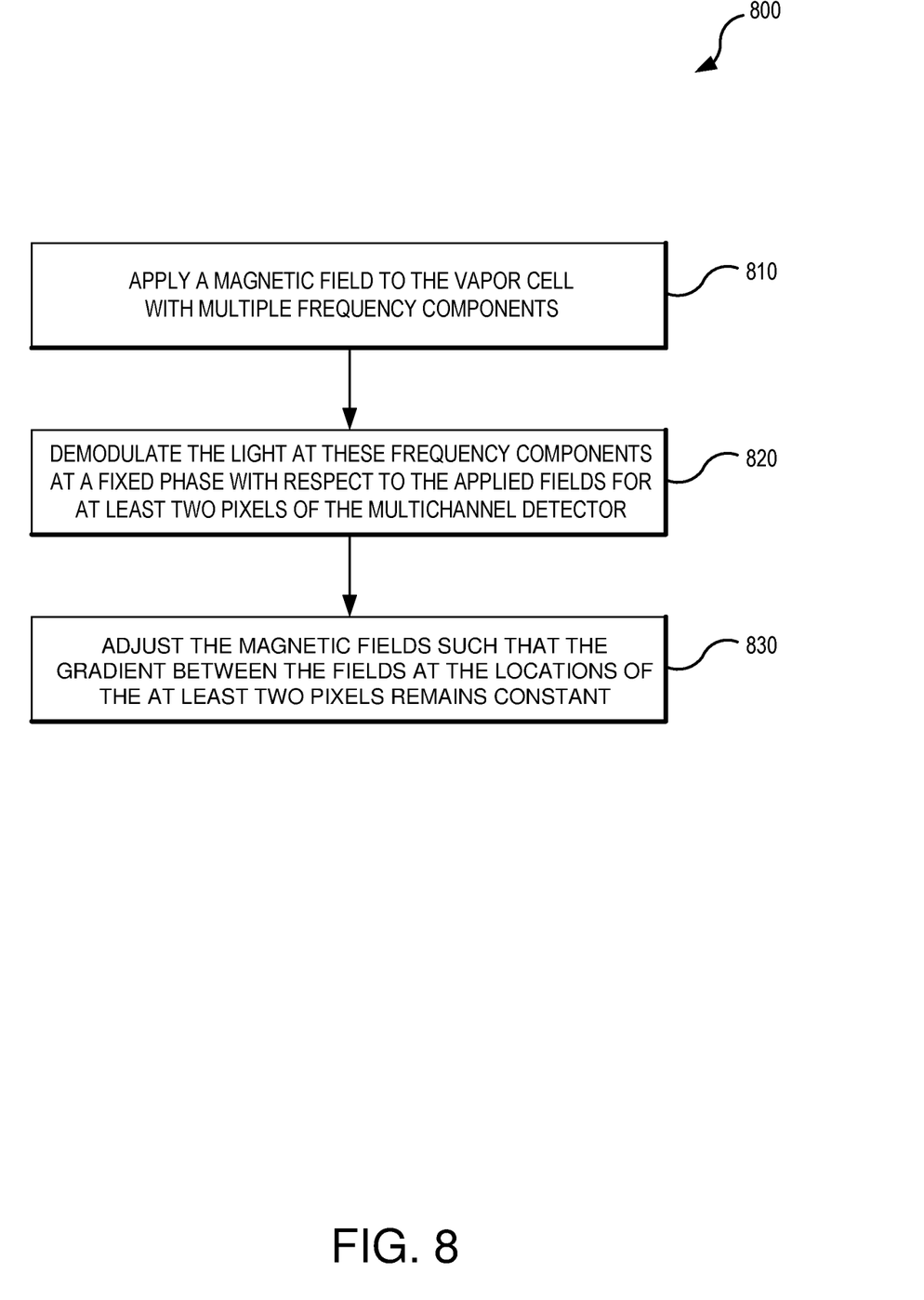
FIG. 8 is a flowchart illustrating a set of operations for gradient cancellation in accordance with some embodiments of the present technology.

FIG. 8 is a flowchart illustrating a set of operations 800 for gradient cancellation in accordance with some embodiments of the present technology. As illustrated in FIG. 8, application operation 810 applies magnetic fields to the vapor cell with one or multiple frequency components. Demodulation operation 820 demodulates the light at these frequency components at a fixed phase with respect to the applied fields for at least two pixels of the multichannel detector with a lock-in amplifier. Adjustment operation 830 adjusts the magnetic gradient fields such that the difference of the demodulation outputs of the at least two pixels remains constant.

Figure 9:
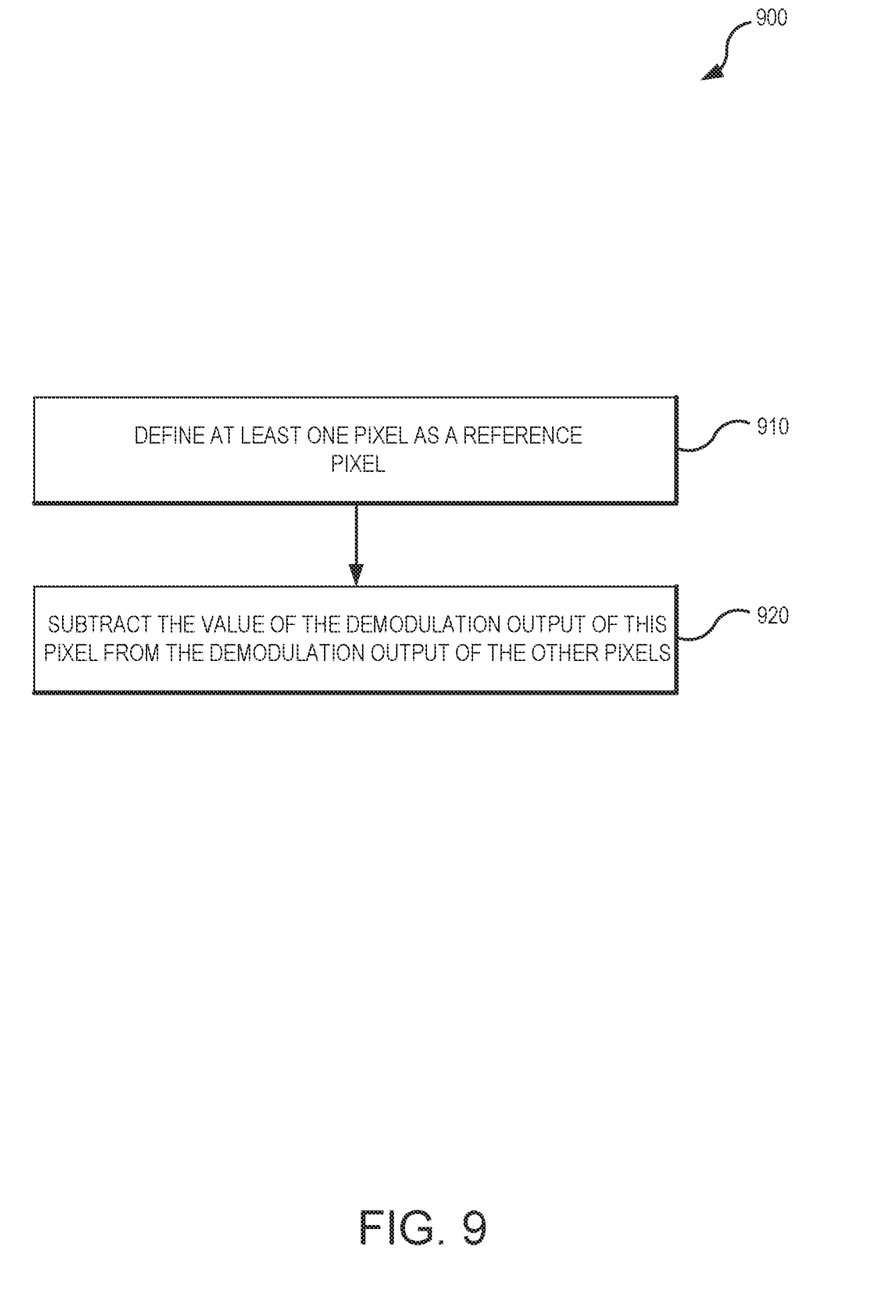
FIG. 9 is a flowchart illustrating a set of operations for noise cancellation in accordance with some embodiments of the present technology.

FIG. 9 is a flowchart illustrating a set of operations 900 for noise cancellation with gradiometry in accordance with some embodiments of the present technology. As illustrated in FIG. 9, reference operation 910 defines at least one pixel as the reference pixel. Subtraction operation 920 subtract the value of the demodulation output of this pixel from the demodulation output of the other pixels.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A magnetographic camera based on an optically pumped magnetometer (OPM) for measuring a spatial distribution of a magnetic field produced by a sample that may be stationary in time or may dynamically vary with time, the magnetographic camera comprising:

a housing for containing a magnetic field detector including a single vapor cell to receive the magnetic field produced by the sample positioned proximal to the single vapor cell;

a single multi-channel detector array; and a laser light source positioned upstream of the single vapor cell to illuminate the single vapor cell and thereby cause a distribution of light representative of the spatial distribution of the magnetic field produced by the sample inside the single vapor cell to be transmitted along a single optical path as a single light beam to the single multi-channel detector array, wherein the single multi-channel detector array is positioned downstream of the single vapor cell and at a downstream end of the single optical path, and is configured to:
receive the single light beam;
generate a magnetic field image of the sample; and
encode and store the magnetic field image of the sample that is spatially encoded as a photographic image of a distribution of light corresponding to pixels or voxels within the single vapor cell.

2. The magnetographic camera of claim 1, further comprising a magnetic field cancellation system in which magnetic field interference from an environmental magnetic field is reduced to a level below a magnetic field from samples of interest.

3. The magnetographic camera of claim 2, wherein the magnetic field cancellation system includes three sets of magnetic field noise cancellation coils.

4. The magnetographic camera of claim 3, wherein a first set of coils produces a magnetic field perpendicular to a surface of the optical detector, a second set of coils produces a magnetic field horizontal along one axis, and a third set of coils produces a horizontal magnetic field along a direction orthogonal to the second set of coils.

5. The magnetographic camera of claim 3, further comprising a magnetic field reference detector to measure an ambient background magnetic field.

6. The magnetographic camera of claim 5 further comprising a controller configured to provide an electric current proportional to a magnetic variation sensed by the magnetic field reference detector to the three sets of magnetic field noise cancellation coils thereby reducing the environmental magnetic field sensed by the OPM.

7. The magnetographic camera of claim 1, wherein the multi-channel detector array comprises a complementary metal-oxide semiconductor (CMOS) device.

8. The magnetographic camera of claim 1, wherein the multi-channel detector array comprises a charge-coupled device (CCD).

9. The magnetographic camera of claim 1, wherein the sample is a biological sample or a non-biologic sample.

10. The magnetographic camera of claim 1, further comprising the magnetic field detector positioned in the housing and comprising an evacuated box made at least partially of an optically transparent material allowing light from the laser light source to pass through.

11. The magnetographic camera of claim 10, wherein the optically transparent material includes glass.

12. The magnetographic camera of claim 10, wherein the single vapor cell is filled with a spin-polarizable atomic species.

13. The magnetographic camera of claim 12, wherein the magnetic field detector further comprises thermal standoffs to thermally insulate the evacuated box from the single vapor cell.

14. The magnetographic camera of claim 12, wherein the magnetic field detector further comprises heater to heat the single vapor cell to a desired temperature.

15. The magnetographic camera of claim 14, wherein the desired temperature to heat the single vapor cell is above 120° C.

16. The magnetographic camera of claim 12, wherein the spin-polarizable atomic species includes alkali atoms.

17. The magnetographic camera of claim 12, wherein the single vapor cell has a thickness between 10 μm and 1,000 μm to increase spatial resolution of magnetic field detection to a pixel size as small as 35 μm×35 μm and to increase temporal resolution to more than 1,000 frames per second (fps).

18. The magnetographic camera of claim 12, further comprising a vacuum enclosure in which the single vapor cell is suspended.

19. The magnetographic camera of claim 10, wherein the magnetic field detector further comprises a molecular sieve to improve a vacuum.

* * * * *